(12) United States Patent
Webster et al.

(10) Patent No.: US 7,701,985 B2
(45) Date of Patent: Apr. 20, 2010

(54) SOI-BASED TUNABLE LASER

(75) Inventors: Mark Webster, Bethlehem, PA (US); David Piede, Allentown, PA (US); Prakash Gothoskar, Allentown, PA (US)

(73) Assignee: Lightwire, Inc., Allentown, PA (US)

( * ) Notice: Subject to any disclaimer, the term of this patent is extended or adjusted under 35 U.S.C. 154(b) by 0 days.

(21) Appl. No.: 12/291,246

(22) Filed: Nov. 6, 2008

(65) Prior Publication Data
US 2009/0135861 A1    May 28, 2009

Related U.S. Application Data

(60) Provisional application No. 61/002,509, filed on Nov. 9, 2007.

(51) Int. Cl.
*H01S 3/10* (2006.01)
*H01S 3/13* (2006.01)
(52) U.S. Cl. .................................. 372/20; 372/29.016
(58) Field of Classification Search .................. 372/20, 372/29.016, 29.023
See application file for complete search history.

(56) References Cited

U.S. PATENT DOCUMENTS

| 6,071,426 | A  | 6/2000  | Lee et al.      |
|-----------|----|---------|-----------------|
| 6,972,907 | B2 | 12/2005 | Kozklovsky et al.|
| 2006/0050744 | A1 | 3/2006 | Wong et al.     |
| 2007/0280326 | A1 | 12/2007 | Piede et al.   |

*Primary Examiner*—Armando Rodriguez
(74) *Attorney, Agent, or Firm*—Wendy W. Koba

(57) ABSTRACT

A silicon-on-insulator (SOI)-based tunable laser is formed to include the gain medium (such as a semiconductor optical amplifier) disposed within a cavity formed within the SOI substrate. A tunable wavelength reflecting element and associated phase matching element are formed on the surface of the SOI structure, with optical waveguides formed in the surface SOI layer providing the communication between these components. The tunable wavelength element is controlled to adjust the optical wavelength. Separate discrete lensing elements may be disposed in the cavity with the gain medium, providing efficient coupling of the optical signal into the SOI waveguides. Alternatively, the gain medium itself may be formed to include spot converting tapers on its endfaces, the tapers used to provide mode matching into the associated optical waveguides.

10 Claims, 3 Drawing Sheets

SOI-BASED TUNABLE LASER

CROSS-REFERENCE TO RELATED APPLICATIONS

This application claims the benefit of U.S. Provisional Application No. 61/002,509, filed Nov. 9, 2007.

TECHNICAL FIELD

The present invention relates to a tunable laser and, more particularly, to a silicon-on-insulator (SOI)-based tunable laser with a gain medium disposed within a cavity formed within the SOI substrate.

BACKGROUND OF THE INVENTION

There is an increasing demand for tunable lasers given the advent of wavelength-division multiplexing (WDM) which has become widespread in fiber optic communication systems. WDM transponders include a laser, modulator, a receiver and associated electronics. One WDM transponder operates a fixed laser in the near-infrared spectrum at around 1550 nm. A 176 wavelength system uses one laser per wavelength and, therefore, such a system typically must store a 176 additional WDM transponders as "spares" to deal with failures. The high inventory requirement contributes to the high cost of those systems.

In response, tunable lasers have been developed. A single tunable laser can serve as a back-up for multiple channels or wavelengths so that fewer WDM transponders need to be stocked for spare parts. Tunable lasers can also provide flexibility at multiplexing locations, where wavelengths can be added and dropped from fibers as needed. Accordingly, tunable lasers can help carriers effectively manage wavelengths throughout a fiber optics network.

The currently available tunable lasers are distributed feedback (DFB) lasers and distributed Bragg reflector (DBR) lasers. A conventional prior art tunable laser module 1 is illustrated in FIG. 1. In tunable lasers, the output power is most often measured from the front of gain medium 2 of laser device 1, and not from a rear facet (as is done with non-tunable lasers). The output of gain medium 2 is directed through a collimating lens 3 and isolator 4. The optical output then engages a power tap 5 at an angle of about 45°, so that a fraction of the signal is directed toward a detector 6; the remainder of the output passes through lens 7 and into an optical fiber 8. The output from detector 6 is applied to a tuning element 9, which controls the operation of gain medium 2 (for example, through temperature adjustments) to tune the wavelength of laser 1.

One difficulty with many of the conventional prior art tunable lasers, however, is that they require a number of discrete components, these components each having a number of surfaces that may introduce stray, unwanted reflections into the laser, disturbing the ability to "tune" the laser over the desired wavelength range.

As with most communication systems, the efficient use of space and power in optical transmitters (e.g., lasers) is of ever-increasing importance. Further, design considerations for these transmitters must take into account the modularity of the particular components that are included in the network.

It would be desirable, therefore, to configure a tunable laser module which is relatively small in size, yet retains the wide range of tunability needed for many of the desirable WDM applications.

SUMMARY OF THE INVENTION

The need remaining in the prior art is addressed by the present invention which relates to a tunable laser and, more particularly, to a silicon-on-insulator (SOI)-based tunable laser with a gain medium disposed within a cavity formed within the SOI substrate.

In accordance with the present invention, a gain medium (such as, for example, a semiconductor optical amplifier) is disposed within a cavity etched within a SOI substrate. A tunable wavelength reflecting element and associated phase matching element are formed on the surface of the SOI structure, with optical waveguides formed in the surface SOI layer providing the communication between these components. The tunable wavelength element is controlled to adjust the optical wavelength. Separate discrete lensing elements may be disposed in the cavity with the gain medium, providing efficient coupling of the optical signal into the SOI waveguides. Alternatively, the gain medium itself may be formed to include spot converting tapers on its endfaces, the tapers used to provide mode matching into the associated optical waveguides.

The integrated wavelength reflecting element, used to "tune" the wavelength of the lasing device may comprise a tunable Bragg grating, Echelle grating, ring resonator, Rowland circle, or the like, which can be formed within the SOI structure. The integrated wavelength reflecting element can be tuned either thermally, or with free carrier injection.

It is an aspect of the present invention that the positioning of the gain medium within a recessed cavity provides improved thermal isolation between the gain medium and the remainder of the optical components of the laser.

Advantageously, the formation of an SOI-based tunable laser in accordance with the present invention is a fully-integrated, monolithic structure where all elements are formed within the SOI substrate. Other opto-electronic components may also be formed within the same substrate, providing a relatively compact arrangement as preferred for applications currently under development.

Other and further aspects and embodiments of the SOI-based tunable laser of the present invention will become apparent during the course of the following discussion and by reference to the accompanying drawings.

BRIEF DESCRIPTION OF THE DRAWINGS

Referring now to the drawings.

DETAILED DESCRIPTION

Figure 1:
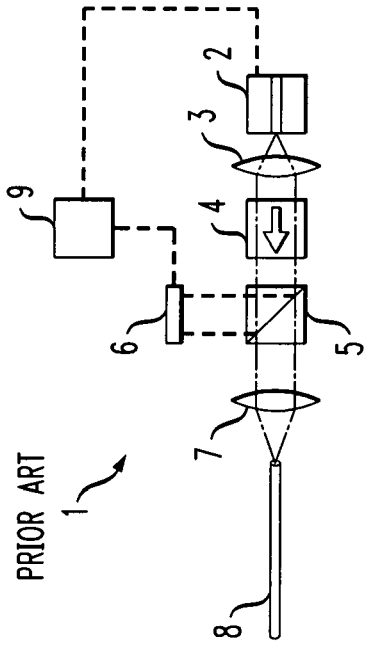
FIG. 1 illustrates a prior art discrete tunable laser arrangement.
Figure 2:
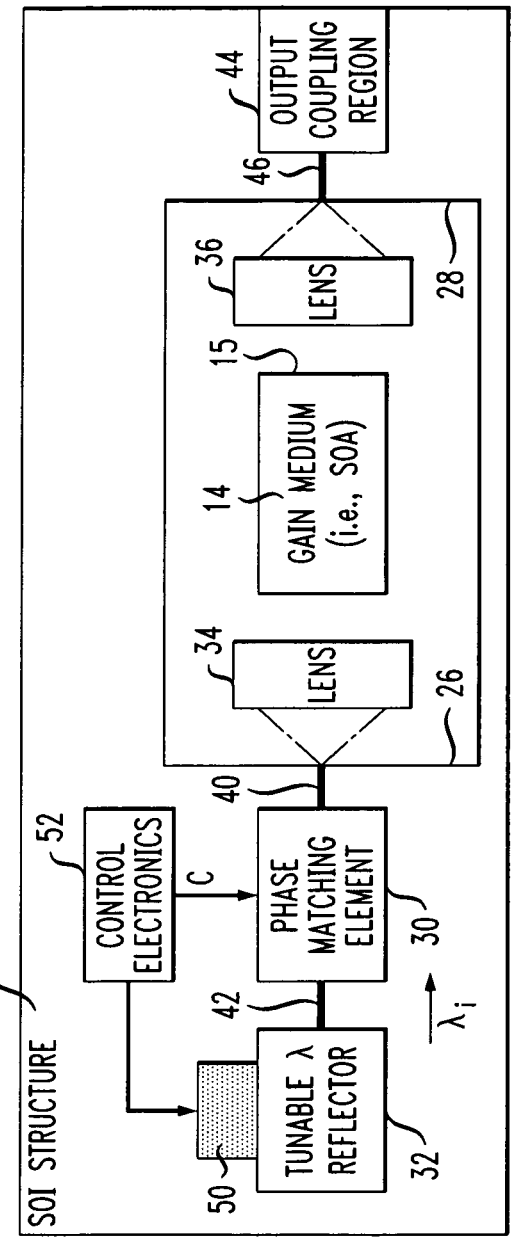
FIG. 2 is a top view of an exemplary SOI-based tunable laser formed in accordance with the present invention.
Figure 3:
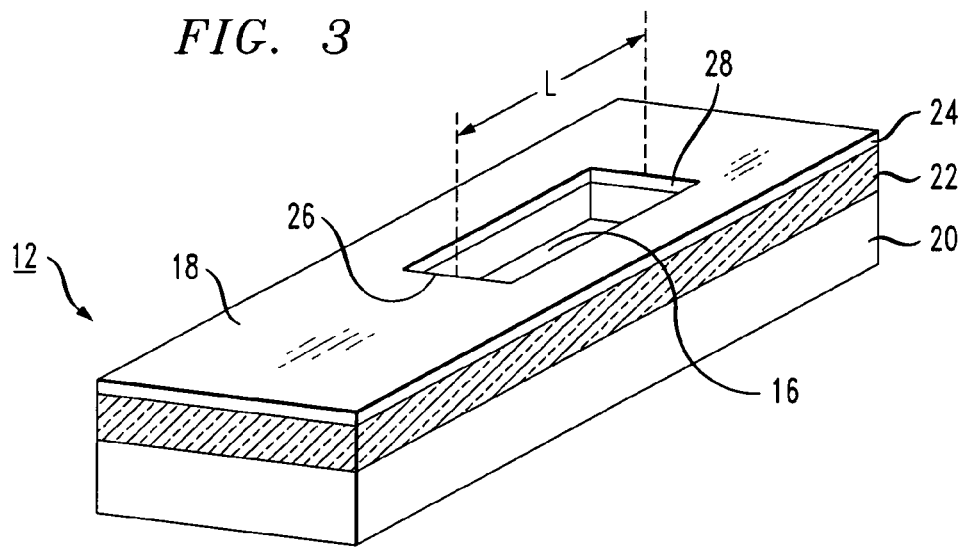
FIG. 3 contains an isometric view of an exemplary SOI structure, formed to include a cavity for supporting the gain medium in accordance with the present invention.

FIG. 2 is a top view of an exemplary SOI-based tunable laser 10 formed in accordance with the present invention within an SOI structure 12. Tunable laser 10 includes a gain medium 14, such as a semiconductor optical amplifier, disposed within a cavity 16 formed through a top surface 18 of SOI structure 12. FIG. 3 is an isometric view of exemplary SOI structure 12 within which an exemplary laser cavity 16 is formed. As best shown in FIG. 3, SOI structure 12 comprises a silicon substrate 20, a dielectric layer 22 formed over substrate 20 and a relatively thin silicon surface layer 24 (hereinafter referred to as "SOI layer 24") disposed over dielectric layer 22. As with many other SOI-based optical arrangements currently being developed, SOI layer 24 is used as the waveguiding layer to support the transmission of optical signals within tunable laser 10 in the manner to be described in detail below.

Advantageously, the use of silicon materials in the formation of structure 12 allows for cavity 16 to be formed using well-known CMOS fabrication techniques. As a result, sidewalls 26 and 28 of cavity 16 are created to exhibit optically smooth surfaces. For example, by forming sidewalls 26 and 28 with techniques such as, for example, reactive ion etching, little if any light will be scattered out of cavity 16 by irregularities on sidewalls 26 and 28.

In accordance with the present invention, gain medium 14 may take the form of a semiconductor optical amplifier, such as an InP-based or GaAs-based component. In contrast to various prior art silicon-based laser arrangements where the gain medium is directly bonded to the surface of the SOI structure, gain medium 14 of the inventive laser arrangement is disposed within cavity 16, below surface 18 of SOI structure 12. In the prior art, the need to directly bond the gain medium to the SOI surface created thermal issues as a result of the heat generated by the gain medium. By virtue of isolating gain medium 14 from the remaining optical components of tunable laser 10, the thermal stability of the laser structure is improved over the prior art arrangements.

Referring again to FIG. 2, the remaining components of SOI-based tunable laser 10 are shown as comprising a phase matching element 30 and a tunable wavelength reflecting element 32, both integrated within SOI layer 24 of SOI structure 12. The laser cavity is thus defined by tunable wavelength reflecting element 32 and endface 15 of gain medium 14. In accordance with the present invention, tunable wavelength reflecting element 32 is utilized to select a particular wavelength, denoted $\lambda_i$, that will be the lasing output wavelength from tunable laser 10. Element 32 may comprise, for example, a Bragg grating, Echelle grating, a ring resonator structure, Rowland circle or the like, which is directly formed within SOI layer 24 and tuned in the manner discussed below.

It is important that the reflected signal be in phase with the signal propagating through optical gain medium 14 (i.e., constructive interference) so that the signals "add" and are amplified within cavity 16. To this end, tunable phase matching element 30 is disposed between optical gain medium 14 and tunable wavelength reflecting element 32 to adjust the phase of the reflected signal until it matches the phase of the signal within the laser cavity. Phase matching element 30 may comprise, for example, an electro-absorption modulator which is directly integrated within SOI layer 24 of SOI structure 12. In accordance with the present invention, a separate, tunable electrical control signal C is applied as an input to phase matching element 30. The application of electrical control signal C will adjust the degree of phase shift. As with wavelength reflecting element 32, tunable phase matching element 30 can be controlled (either thermally or by free carriers) to modify the optical path length and provide phase tuning/matching.

Inasmuch as gain medium 14 is disposed within cavity 16 below the surface of SOI structure 12 (and, therefore, below SOI layer 24), a focusing arrangement is required to couple the propagating signals between SOI layer 24 and gain medium 14. Referring to FIG. 2, a pair of focusing lenses 34 and 36 are shown as disposed within cavity 16 to efficiently couple the light from gain medium 14 into associated waveguides formed along SOI layer 24 which support the transmission of the laser output. Alternatively, gain medium 14 itself may be formed to include spot-converting tapers (not shown) which are used to match the mode profiles of the coupling waveguides formed within SOI layer 24.

Referring to the particular embodiment of FIG. 2, first focusing lens 34 is disposed in cavity 16 behind gain medium 14 and is used to focus the rearwardly-transmitted light signal into an optical waveguide 40 which is used to couple this signal into phase matching element 30. In one embodiment, optical waveguide 40 may comprise a nanotaper coupling waveguide, thus ensuring that optimum coupling efficiency is maintained within the tunable laser structure. A second optical waveguide 42 is formed within SOI layer 24 and is used to couple the propagating optical signal between phase matching element 30 and tunable wavelength reflecting element 32. Second focusing lens 36 is disposed beyond endface 15 of lasing medium 14 and is used to couple the lasing output signal into output coupling region 44 via an optical waveguide 46. Again, optical waveguide 46 is preferably a nanotaper coupling waveguide used to provide mode matching between the output of lasing medium 14 and output coupling region 44. It is to be understood that the illustrated coupling arrangements are exemplary only and various other means of providing optical coupling are capable of being integrated within an SOI structure and used in conjunction with the SOI-based tunable laser of the present invention.

Figure 4:
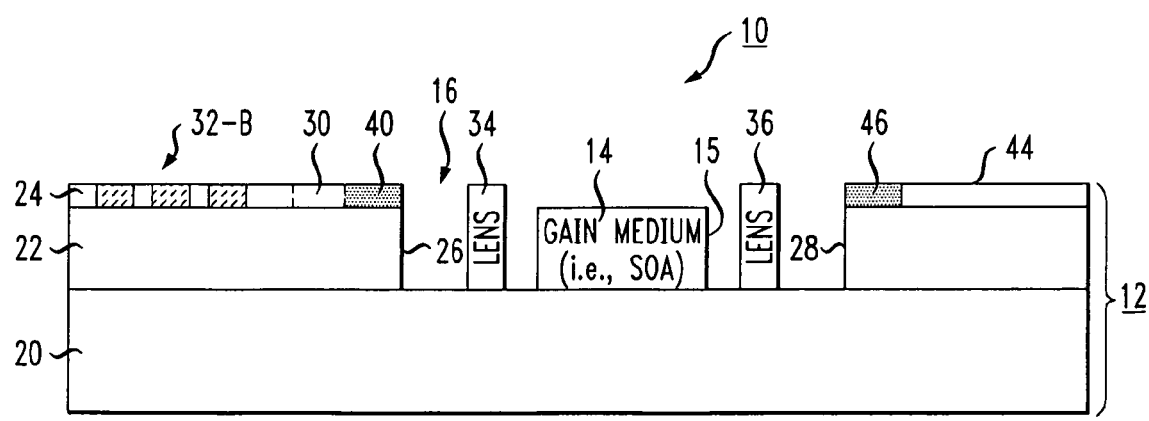
FIG. 4 is a side view of the arrangement of FIG. 3.

As mentioned above, tunable wavelength reflecting element 32 may comprise a number of different elements which may be incorporated within SOI layer 24. In the particular side view of FIG. 4, tunable wavelength reflecting element 32 comprises a Bragg grating structure 32-B. Bragg grating 32-B may comprise a plurality of oxide regions as grating elements, where the combination of silicon and oxide results in a grating with a strong contrast ratio (i.e., difference in refractive index values). In accordance with the present invention, Bragg grating 32-B may be tunable by either thermal or free carrier means.

In one embodiment, therefore, and as particularly illustrated in FIG. 2, SOI-based tunable laser 10 of the present invention further comprises a thermally conductive strip 50 disposed adjacent to tunable wavelength reflecting element 32. Thermally conductive strip 50 may comprise, for example, a SOI waveguide strip or a strip of a silicide material. When an electrical current is passed through thermally conductive strip 50, the temperature of strip 50 will increase as a function of the electrical current level and the sheet resistance of strip 50. Presuming that tunable wavelength reflecting element 32 comprises a Bragg structure 32-B, the change in temperature will quickly propagate into the silicon portion of grating structure 32-B and thus change the refractive index value of the silicon portion of the grating. As a result, therefore, the reflected wavelength of grating structure 32-B will change (i.e., be "tuned") as a function of the current applied to thermally conductive strip 50. Control electronics 52 is used to generate and apply the electrical current to strip 50, where the value of the applied current is adjusted to "tune" the center wavelength of tunable wavelength reflecting element 32.

Simulations have shown that a single mode waveguide formed with a cross-section on the order of 0.1 $\mu m^2$ can be thermally tuned in a very efficient manner, on the order of 0.015 mW/° C./$\mu$m. Depending on the required wavelength selectivity, grating 34 may comprise a length anywhere in the range of 10-500 $\mu$m, with a nominal value of approximately 50 μm. Presuming that the default "selected" wavelength of laser 10 is 1550 nm, and a tuning range Δλ of about 31 nm is desired, a change in refractive index (Δn) for grating element 34 of about 2% is required. In silicon, Δn is approximately $1.6 \times 10^{-4}/°C$.

Figure 5:
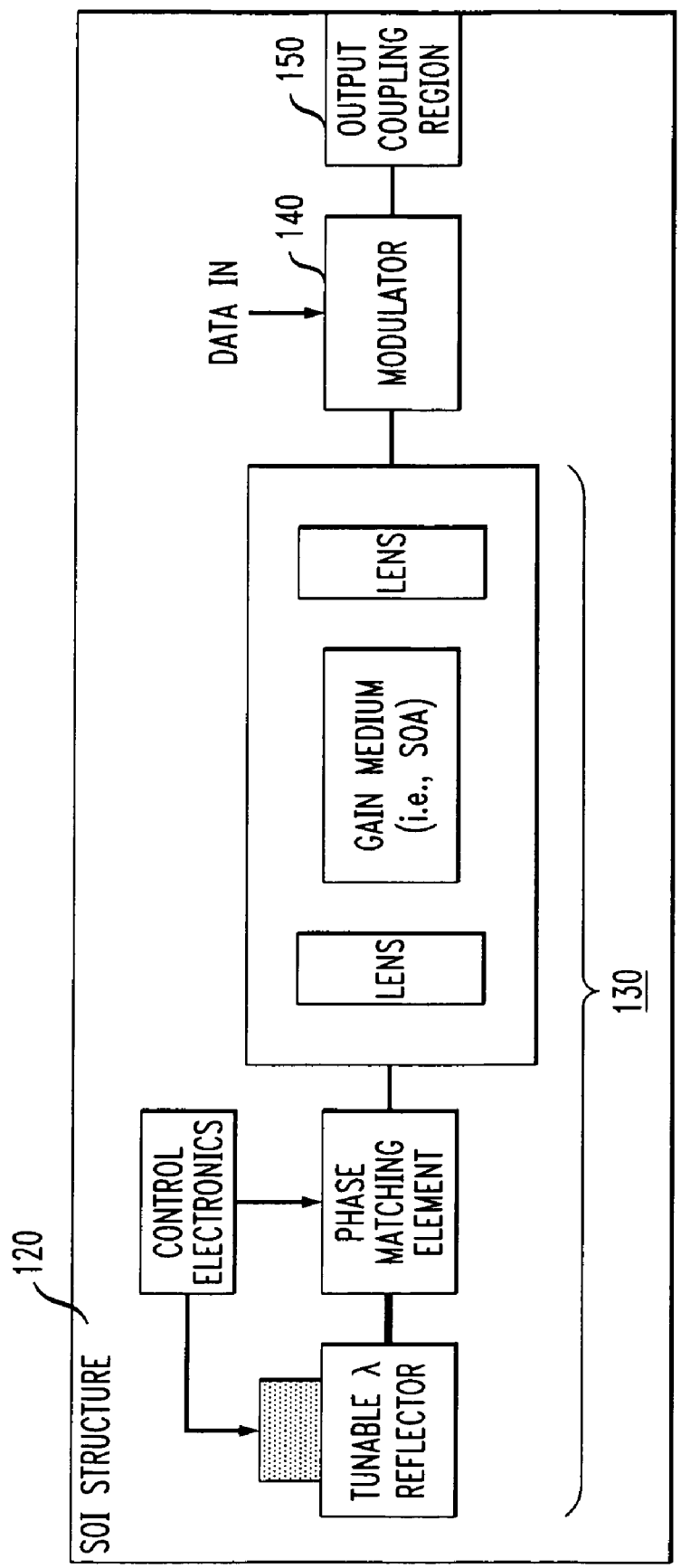
FIG. 5 is a top view of another embodiment of the present invention, in this case incorporating an opto-electronic modulator with a tunable laser within a single SOI structure.

As mentioned above, an advantage of the SOI-based tunable laser of the present invention is that it may be integrated with other opto-electronic components within a single SOI structure to form a compact, monolithic opto-electronic structure. FIG. 5 illustrates one exemplary optical transmitter 100 formed within an SOI structure 120, where transmitter 100 includes an SOI-based tunable laser 130 formed in the manner described above, with the lasing output from cavity 16 (i.e., the lasing output at the desired wavelength) thereafter used as the optical input to an opto-electronic modulator 140. Modulator 140 may comprise, for example, a SISCAP modulator as described in U.S. Pat. No. 6,845,198, issued on Jan. 18, 2005 to R. K. Montgomery et al. and assigned to the assignee of this application and hereby incorporated by reference. An electrical data signal to be transmitted is also applied to modulator 140, where the modulated optical output signal from modulator 140 is thereafter coupled into output coupling region 150 of SOI structure 120. Output coupling region 150, in one embodiment, may comprise a nanotaper coupling waveguide which is used to launch the signal into an associated optical fiber (not shown).

What is claimed is:

1. An SOI-based tunable laser formed within a silicon-on-insulator (SOI) structure comprising a silicon substrate, a dielectric layer disposed over the silicon substrate and a relatively thin silicon surface layer formed over the dielectric layer, the SOI-based tunable laser comprising:
   optical gain medium disposed within a cavity region formed in the SOI structure, the cavity region formed downward from a top major surface of said SOI structure and including optically smooth vertical sidewalls;
   a tunable wavelength reflecting element formed within the SOI structure for selecting a particular wavelength output for said tunable laser;
   a phase matching element formed within the SOI structure and disposed between the tunable wavelength reflecting element and the optical gain medium; and
   optical waveguides formed along the relatively thin silicon surface layer to interconnect said optical gain medium, tunable wavelength reflecting element and phase matching element.

2. An SOI-based tunable laser as defined in claim 1 wherein the tunable wavelength reflecting element is selected from the group consisting of: Bragg gratings, Echelle gratings, ring resonators, Rowland circles.

3. An SOI-based tunable laser as defined in claim 1 wherein the phase matching element comprises an electro-absorption modulator formed within the SOI structure.

4. An SOI-based tunable laser as defined in claim 1 wherein the phase matching element comprises a thermal tuning element formed within the SOI structure.

5. An SOI-based tunable laser as defined in claim 1 wherein the optical gain medium comprises a semiconductor optical amplifier.

6. An SOI-based tunable laser as defined in claim 1 wherein the tunable laser further comprises
   a first lensing element disposed in the cavity region between the optical gain medium and the phase matching element.

7. An SOI-based tunable laser as defined within claim 6 wherein the tunable laser further comprises a second lensing element disposed within the cavity region at the output of the optical gain medium.

8. An SOI-based tunable laser as defined in claim 1 wherein the optical gain medium includes spot converting tapers on the endfaces thereof.

9. An SOI-based tunable laser as defined in claim 1 wherein the tunable laser further comprises a temperature control element coupled to the tunable wavelength reflecting element for providing tuning to the wavelength reflected by said tunable wavelength reflecting element.

10. An SOI-based optical arrangement formed within a silicon-on-insulator (SOI) structure comprising a silicon substrate, a dielectric layer disposed over the silicon substrate and a relatively thin silicon surface layer formed over the dielectric layer, the SOI-based optical arrangement comprising:
   a tunable laser including:
      optical gain medium disposed within a cavity region formed in the SOI structure, the cavity region formed downward from a top major surface of said SOI structure and including optically smooth vertical sidewalls;
      a tunable wavelength reflecting element formed within the SOI structure for selecting a particular wavelength output for said tunable laser;
      a phase matching element formed within the SOI structure and disposed between the tunable wavelength reflecting element and the optical gain medium; and
      optical waveguides formed along the relatively thin silicon surface layer to interconnect said optical gain medium, tunable wavelength reflecting element and phase matching element; and
   an opto-electronic modulator formed within the SOI structure and disposed to receive the lasing output signal generated by the tunable laser, the opto-electronic modulator also responsive to an input electronic data signal for providing as an output a modulated optical signal representative of the input electronic data signal.

* * * * *